FIG. I

INVENTORS.
RAYMOND J. GOETZ
THOMAS W. HAWKINS
JOSEPH ROSE
BY Sughrue, Rothwell, Mion, Zinn & Macpeak
ATTORNEYS.

INVENTORS.
RAYMOND J. GOETZ
THOMAS W. HAWKINS
JOSEPH ROSE

BY Sughrue, Rothwell, Mion, Zinn & Macpeak
ATTORNEYS.

INVENTORS
RAYMOND J. GOETZ
THOMAS W. HAWKINS
JOSEPH ROSE
BY Sughrue, Rothwell, Mion, Zinn & Macpeak
ATTORNEYS INVENTORS.
RAYMOND J. GOETZ
THOMAS W. HAWKINS
JOSEPH ROSE
BY
Sughrue, Rothwell, Mion, Zinn & Macpeak
ATTORNEYS.

INVENTORS.
RAYMOND J. GOETZ
THOMAS W. HAWKINS
JOSEPH ROSE
BY
Sughrue, Rothwell, Mion, Zinn & Macpeak
ATTORNEYS.

United States Patent Office 3,420,430
Patented Jan. 7, 1969

3,420,430

AUTOMATED HOT GAS SOLDERING APPARATUS FOR ATTACHING A PLURALITY OF FLAT PACK INTEGRATED CIRCUITS TO A PRINTED CIRCUIT SUBSTRATE

Raymond J. Goetz, Thomas W. Hawkins and Joseph F. Rose, Baltimore, Md., assignors to Martin-Marietta Corporation, New York, N.Y., a corporation of Maryland Filed May 5, 1967, Ser. No. 636,360
U.S. Cl. 228—47 14 Claims
Int. Cl. H05k 3/34

ABSTRACT OF THE DISCLOSURE

Fully automated apparatus for moving a plurality of rows of multi-lead integrated circuit flat pack components carried by a printed circuit board past associated nozzles directing heated fluid jets locally on the component lead contact areas to effect high speed, controlled reflow soldering of the individual component leads to the printed circuit conductors.

To date, the leads of electronic integrated flat pack circuits and other electrical and electronic components have been soldered down to a printed circuit baseboard or substrate by conventional soldering irons in which an operator manually attaches one lead at a time to the printed circuit board conductor. In an attempt to increase lead attachment time, operators have used a multi-tip iron, which, at most, solders only one half of the flat pack leads in a single soldering stroke. These methods are reliable, depending upon the skill of the operator, but they do not lend themselves to high production. For example, a single soldering iron in use by a skilled technician, achieves the attachment of one flat pack circuit having 14 leads in approximately 18 seconds. Even if the operator uses the multi-tip or broad tip iron, he can solder the 14 leads in only about half the time. Further, there are a relatively large number of rejects. Each component flat pack conventionally comprises a rectangular element a quarter of an inch or less in length and width with 7 or more leads carried on each side and spaced rather closely. In using the soldering iron to couple the lead to the underlying printed circuit conductor, the hot soldering iron tip may inadvertently contact the integrated circuit itself, either destroying the same or reducing its useful life.

It is, therefore, a primary object of this invention to provide a fully automated soldering apparatus for greatly increasing the time rate of soldering integrated circuit electronic component leads to a printed circuit substrate.

It is a further object of this invention to provide an apparatus of this type in which the number of rows of multi-lead electronic components being soldered may be readily varied without affecting the time rate of soldering the individual component leads.

It is a further object of this invention to provide a fully automated soldering apparatus of this type which ensures localized heating of the component leads with minimum thermal stress to the electronic components themselves.

It is a further object of this invention to provide a fully automated soldering apparatus for soldering flat pack integrated circuit component leads to a printed circuit baseboard in which the baseboard is moved relative to spaced, stationary hot fluid jets and in which the velocity of the printed circuit board, the flow rate of the impinging fluid and the fluid temperature may be readily controlled.

It is a further object of this invention to provide an improved, fully automated soldering apparatus of this type in which the heating means inherently tends to clean the area being soldered, while surrounding the solder area in an inert atmosphere.

It is a further object of this invention to provide a component positioning jig for easily, quickly and accurately positioning a plurality of electronic components on a substrate to facilitate automatic soldering of the component leads.

Other objects of this invention will be pointed out in the following detailed description and claims and illustrated in the accompanying drawings which disclose, by way of example, the principle of this invention and the best mode which has been contemplated of applying that principle.

In general, the present invention is directed to an automated apparatus for the high speed soldering of electronic component leads to a substrate or substrates carrying the same. The substrate is mounted on a carrier and means are provided for supporting a plurality of components on the substrate with the leads extending therefrom in parallel rows. Soldering head assemblies in juxtaposition to the substrate carrier direct heated gas locally onto lead portions in contact wtih the substrate and means are provided for moving the substrate carrier relative to the soldering head assemblies in the direction of the row axis to effect soldering.

The carrier may comprise a rectangular plate-like body including rack means fixed to the bottom and the apparatus may further include a continuously driven gear whereby, after manual insertion of the carrier into the front opening of the apparatus, the carrier is driven at a constant velocity along a fixed feed path at right angles to the plane of the soldering head assemblies. The movable carrier may further include a component positioner comprising a bar of insulation material including a longitudinal, central recess for receiving a series of electronic components with the raised outer edges of the bar being slotted to receive the component leads and with the carrier further including means for clamping the component positioner in inverted position upon the substrate. Latching means cooperate with a pair of spaced alignment pins coupled to the carrier body and passing through the component positioner to maintain the components in place with the leads positioned in spaced parallel rows. Each soldering head assembly preferably includes means for individually controlling the heat applied to the hot gas metal delivery tube for heating the same, the rate of flow of gas passing through the tube sections and the spacing between the nozzle ends and the component leads. The apparatus may further include a carrier discharge path at right angles to the carrier feed path into the soldering area with automatic means to facilitate removal of the carrier along the discharge path subsequent to soldering.

Figure 1:
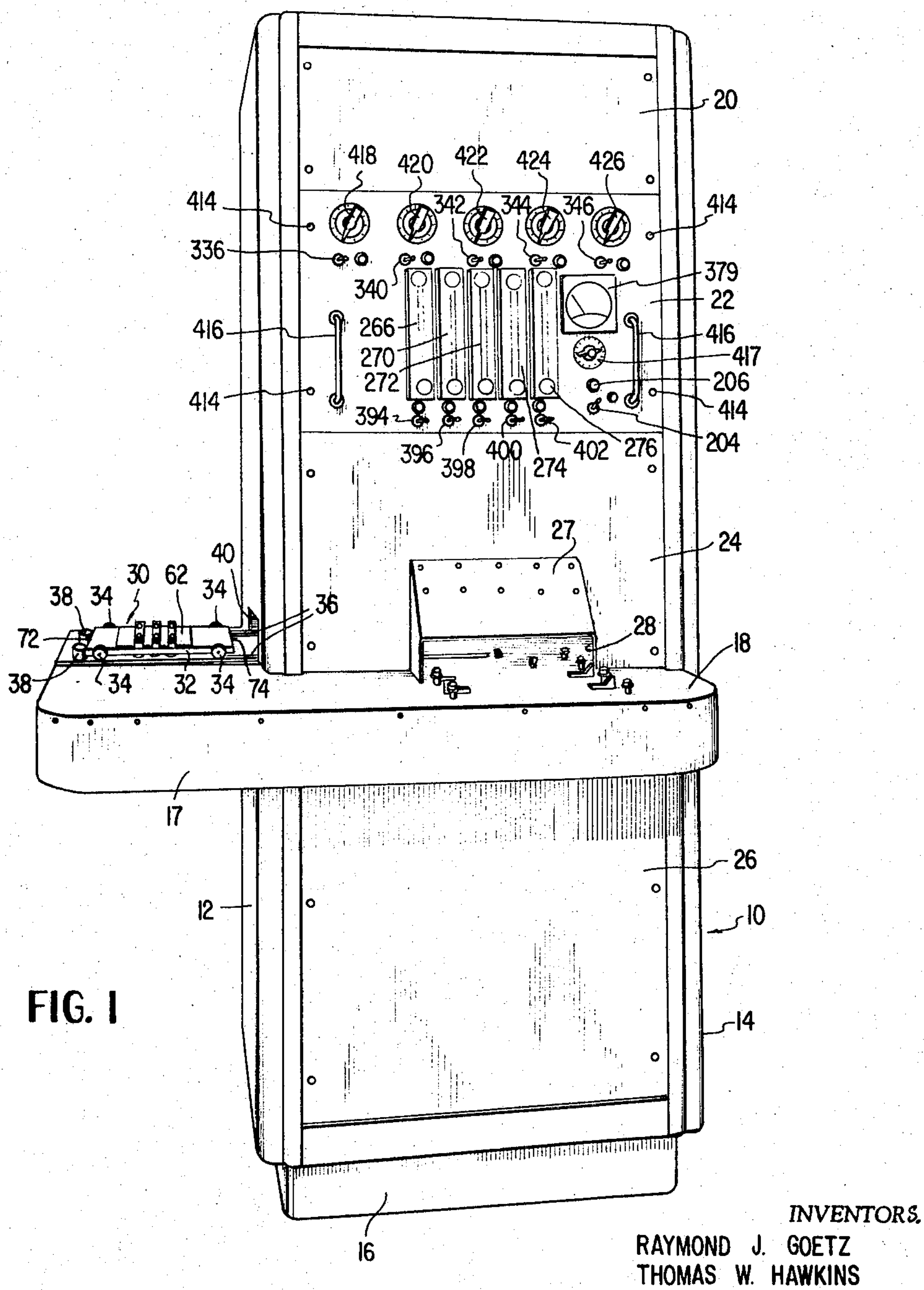
FIGURE 1 is a perspective view of the automated hot gas soldering apparatus of the present invention.

The automated, multiple head, hot gas soldering apparatus of the present invention is shown in FIGURE 1 in console form comprising a rectangular, generally vertically oriented cabinet 10 including spaced side panels 12 and 14, a base section 16, and a horizontally oriented table section 17 including table top 18, which is positioned on the console at approximately waist height. The console further includes removable front wall sections 20, 22, 24 and 26 allowing access to the interior of the console. The front panel section 20 is provided with an inclined hood 27 which projects forwardly of the console and defines, in conjunction with the table top 18, a front access opening 28 which initially receives a printed circuit board transport mechanism or a carrier, indicated at 30, in FIGURE 1. The printed circuit board carrier 30 includes a plate-like base member 32 and spaced wheels 34 which are at that moment contacting spaced, slightly inclined track members 36. The front end of the carrier 30 abuts stops 38 although, if preferred, track extensions (not shown) could extend from the track sections 38 to allow the carrier 30 to continue along a path at right angles to the axis of the console inlet 28 after automated soldering takes place. The track sections 36 extend interiorly of the machine through outlet opening 40 formed within side wall 12 and partially defined by the same table top 18.

Figure 2:
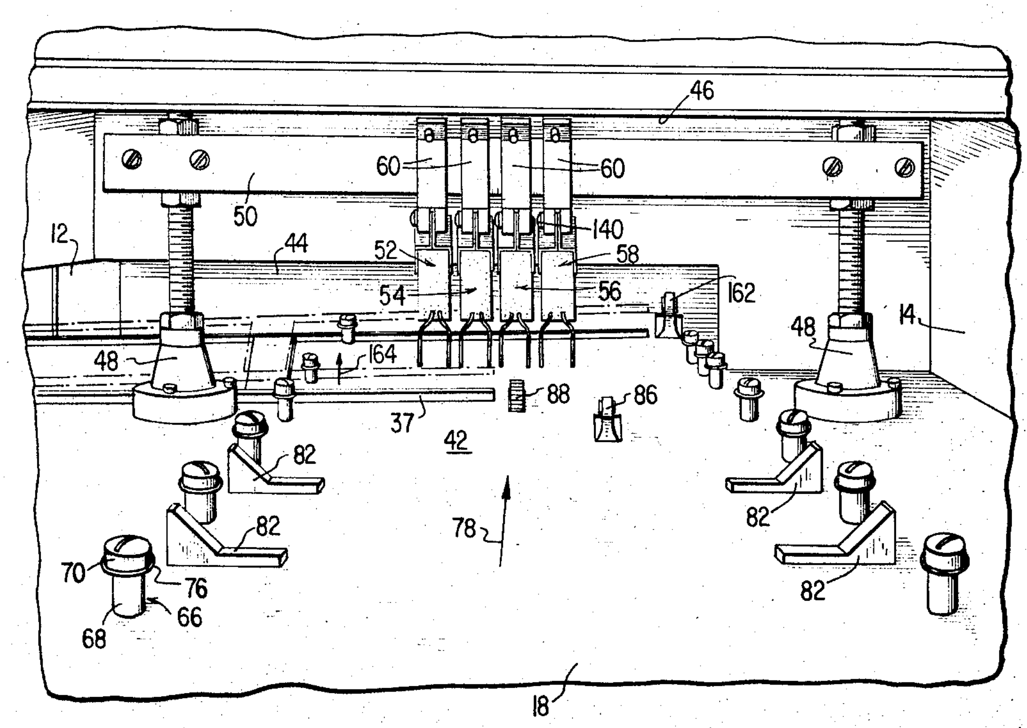
FIGURE 2 is an enlarged perspective view of the portion of the apparatus of FIGURE 1 which receives the component carrying printed circuit baseboard and controllably drives the same past multiple, spaced soldering head assemblies.
Figure 3:
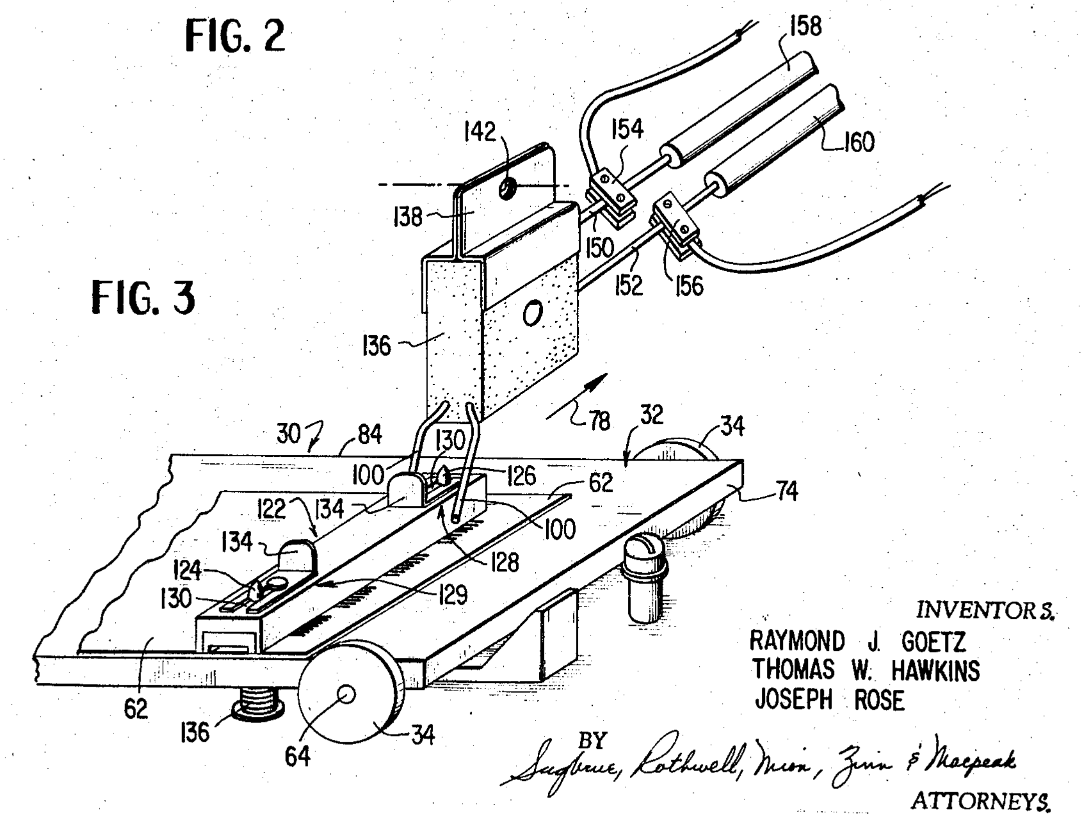
FIGURE 3 is a perspective view of the principal components of the automated soldering apparatus of the present invention in which one row of flat pack integrated circuits carried by a printed circuit board are driven past a stationary soldering head assembly.

In order to better appreciate both the multiple path automated soldering apparatus and the specific carrier for the printed circuit board, preference may be had to FIGURES 2 and 3 of the drawings. Upon removal of the front cover section 24, a soldering chamber or area 42 is exposed, defined by spaced side walls 12 and 14, the top 18 of table 17, rear wall 44 and a horizontal separator 46. Within this space 42, there is provided a pair of spaced, support members 48 to which is threadedly coupled a single transverse support bar 50. The transverse support bar 50, whose height from the table top 18 may be readily adjusted, acts to support a plurality of individual, slidable hot gas soldering head assemblies, indicated from left to right as 52, 54, 56 and 58. For each assembly, the upper support member 60 is open centrally so as to receive bar 50 allowing the individual head assemblies to slide along the axis of the bar. The head assemblies may be laterally adjusted relative to the printed circuit panel 62 or other substrate carried by carrier 30. The wheels 34 of the carrier are mounted by means of axles 64 for free rotation about their axes. However, when the carriers are initially inserted into the entry area or feed opening 28 of the console, they move into the soldering area 42 in a direction parallel to the axis of the wheels 34. In fact, the wheels 34 are not contacting the upper table surface 18 and the carrier is supported above the table by a number of upstanding rotatable guide members 66 forming left and right-hand rows. The guide members 66 include a fixed cylindrical base 68 and a freely revolvable cap 70.

The carrier moves into the soldering area 42, as indicated by arrow 78. The left and right-hand edges 72 and 74, respectively, of the carrier base 32 rest on the radial flanges 76 of the rotating cap as each carrier is manually inserted into the console opening 28. The carrier 30 is then positively driven at a variable but constant speed past the soldering head assemblies. In order to ensure proper orientation of the carrier 30 with respect to the spaced rotatable guide members 66, a pair of inclined, fixed guides 82 are positioned on either side of opening 28 intermediate of the first, second and third rotatable guides 66. This prevents inadvertent depressing of the edges 72 or 74 of the carrier base beneath a rotatable cap 70 of one of the guides during initial insertion of the carrier. As the carrier 30 is manually inserted within the console opening 28, the rear edge 84 of the carrier base strikes microswitch actuator 86 prior to contacting a positively driven pinion 88 positioned slightly to the rear and to the left of the microswitch actuator 86. A rack 89 is fixedly carried on the bottom of the carrier base 74 and is adapted to be engaged by the rotating pinion gear 88 so as to continue movement of the carrier 30 rearwardly in the direction of arrow 78 at a controlled speed relative to the spaced solder head assemblies 52, 54, 56 and 58.

Figures 4, 5:
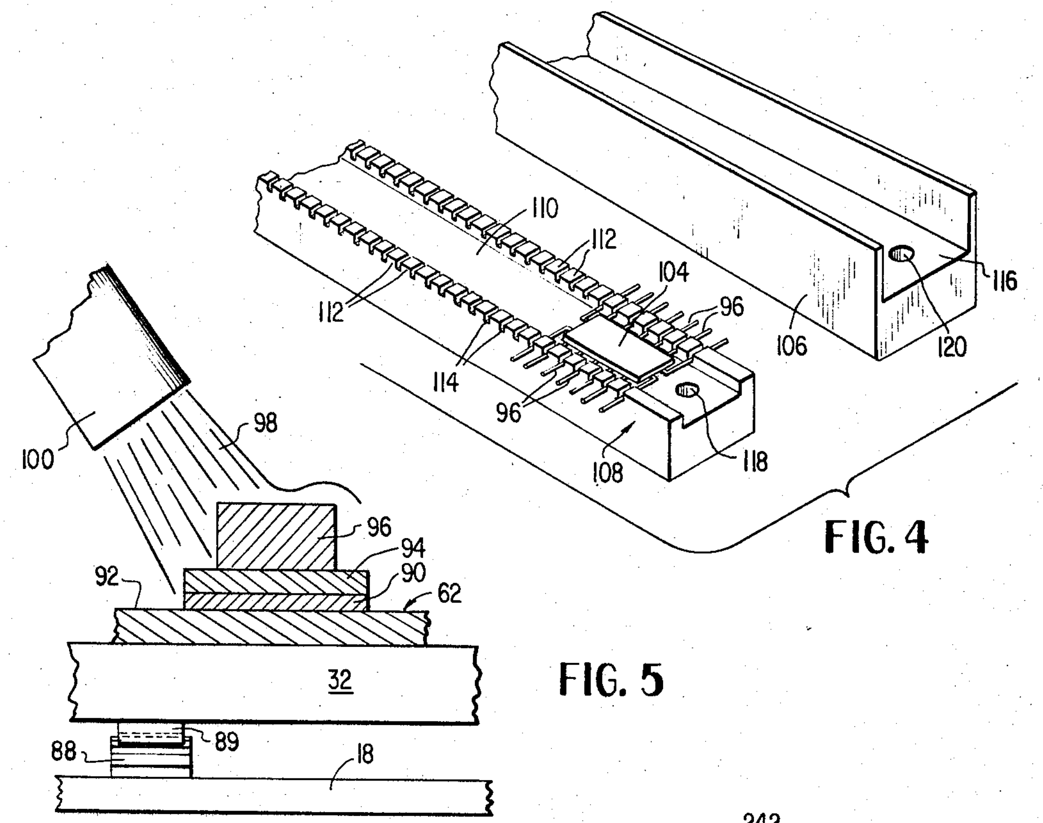
FIGURE 4 is an exploded, perspective view of the unique integrated circuit positioning jig used with the automated soldering apparatus of the present invention.
FIGURE 5 is an elevational view of a portion of the apparatus shown in FIGURE 3 showing the hot gas impinging the printed circuit board conductor and a component lead to effect soldering thereof.

The printed circuit board 62 is provided with a conductive land pattern, including conductor 90 (FIGURE 5), which is carried on the exposed or upper face 92 of the printed circuit board. The conductive land area of the printed circuit board is pretinned by including a layer 94 of solder which, as shown in FIGURE 5, overlies completely the conductor 90. With the lead 96 in contact with the tin conductor, the hot gas 98, being ejected at some velocity from an associated soldering head assembly nozzle 100, causes the pretinned solder layer 94 to melt as the assembly moves relative to the stationary nozzle. As the assembly moves further from beneath the impacting gas flow, cooling effects solidification of the solder layer 94 creating a bond between a localized area of contact 96 and the printed circuit conductor 90.

The present invention involves the use of a rather unique positioning means or jig 102 for holding a plurality of flat pack integrated circuit components 104 in position for soldering on a substrate. The pads are oriented along a common center line such that the individual soldering head assemblies 52, 54, 56 and 58, or more, may each solder localized sections or areas of leads 96 extending outwardly from either side of the rectangular integrated circuit or flat pack 104. The ends of the contacts 96 are pressed down against conductive land portions of the printed circuit board 62. The jig comprises two interfitting parts, an outer metal, U-shaped heat sink member 106 which receives an inner U-shaped component supporting member 108 formed of plastic or other nonconductive material. The inner member 108 comprises a plastic bar whose upper surface is recessed centrally at 110 to provide a pair of raised edges 112. The raised edges are suitably notched at 114 with the notches for both edges being aligned so that they may receive the component leads 96. The central recess 10 carries the circuit portion of the flat pack. The leads 96 are, therefore, securely held in place and with a plurality of flat packs positioned in a row on the supporting member 108, the supporting member 108 is placed, in nested fashion, within central recess 116 of the outer metal member 106. It is noted that the inner plastic member 108 is provided at both ends with pin alignment holes 118, the pin holes 118 conforming to holes 120 carried by the metal outer member 106.

Referring to FIGURE 3, after placement of a series of flat packs 104 in line with each other within the recessed area 110 of the plastic member 108, the integrated circuit positioning assembly or jig 122 is upturned and coupled to the substrate. A pair of spaced, spring-loaded alignment pins 124 and 126 at the front and rear of the carrier 30 are received within cooperating apertures 118 and 120 of the plastic support member and outer heat sink members 106 and 108, respectively. In this case the printed circuit board 62 is also provided with aligned holes (not shown) such that the spaced pins 124 and 126 first pass through the holes of board 62, and then holes carried by the inner plastic flat pack supporting member 108 and the outer heat sink member 106. The outer heat sink member 106 carries slidable, U-shaped latches 128 at either end. The latches may be slid away from each other along the axis of the circuit component installing jig 122, to cause the slotted outer end 130 to engage the reduced cross-section portion of pins 124 and 126. The upstanding tabs 134 permit manual reciprocation of the latching devices 128 once the positioning assembly is positioned in place on the printed circuit board. Each pin is provided with an enlarged head and has a coil spring 136 tending to maintain the enlarged head section of the pin in contact with the sides of the latching device slot. While the alignment pins 124 and 126 are shown as being of the same diameter, the pins may be of different diameters to ensure proper front to back location of each integrated circuit component with respect to the printed circuit board 62. Further, while the leads 96 of the various flat packs 104 appear to extend outwardly from the circuit element itself and occupying the same plane, the leads may be bowed slightly. When the jig 122 is upended and latched in place on the alignment pins 124 and 126, the leads 96 are then resiliently pressed against the land area of the printed circuit board 62 to ensure physical contact with the pretinned conductors 90 prior to actual soldering.

When it is realized that the flat pack integrated circuit elements themselves comprise micro-components, only .058 inch thick, .250 inch square, with the leads being separated by + and − .050 inch, approximately .004 inch thick and .018 inch wide, it is readily seen that the handling and placement of such micro-components represents a very real problem in assembly time and workable component yield due to their extremely small size and fragility. The leads themselves are gold-plated Kovar and the manual handling of these parts causes lead deformation if not circuitry or component damage. The employment of a multi-unit positioning device or jig 122 of the present invention provides a ready method for handling and placing of the electronic integrated circuit flat pack components on the printed circuit board prior to the automated soldering by the method of the present invention. The slotted side walls 112 of the plastic component support member 108 allows the correct placement of component types in a given arrangement or row, while accurately spacing the components with regard to center-to-center component dimensions. The jig ensures resilient clamping of the components to an interconnecting printed circuit board. The outer metallic frame member 106 further acts as a heat sink, as well as the mechanical means of clamping the component leads to the proper printed circuit conductor during the relative movement between the component carrying printed circuit board and the spaced soldering head assemblies 52, 54, 56 and 58. Further, while the jig or positioning assembly 122 is shown as supporting only multiple lead flat pack integrated circuits as micro-components to be mounted on the printed circuit board, it is obvious that conventional single element electronic components, such as resistors, capacitors, etc., may be carried by the same jig.

Figure 7:
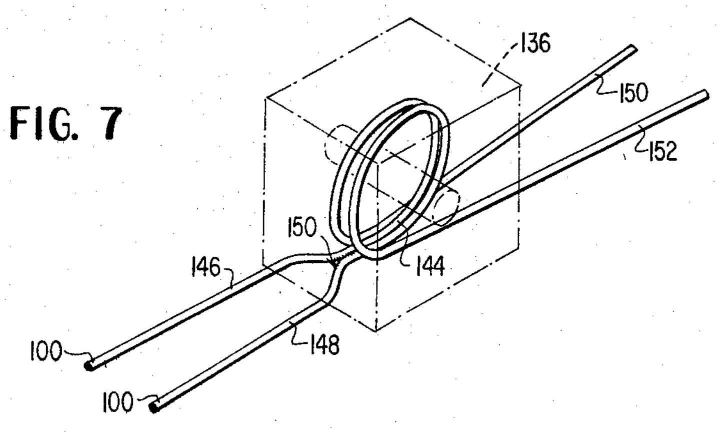
FIGURE 7 is a perspective view of the hot gas, dual nozzle soldering head assembly.

With the flat pack integrated circuit components physically coupled to the upper surface of the printed circuit board 62 by one or more of the spaced mounting jigs 122, the printed circuit board is ready for its positive feed into the soldering area 42 of the console. To effect soldering, a continuous flow of heated gas 98 passes from individual nozzles 100 positioned on each side of jig 122 in juxtaposition to the exposed leads 96. In this respect, a typical hot gas soldering head assembly 58 includes a ceramic support block 136, which is coupled to its support member 60 through the use of C clamp means 138 by bolt 140, the bolt passing through opening 142 at the upper end of the clamp. Referring to FIGURE 7, the ceramic block 136 acts to encapsulate each single loop or turn of the dual nozzle hot gas soldering assembly. Stainless steel tubes 146 and 148 are joined together by a common braze joint 150 near the spaced nozzle ends 100 on the downstream side of the loop area 144. Electrical connection is made to the inner ends 150 and 152 of the stainless steel tube through copper clips 154 and 156, approximately six inches from the brazed joint area 150 to form a closed electrical circuit which in turn heats the gas as it passes through the stainless steel tubing 146 and 148 from the clamping points 154 and 156 to the common braze joint 150. Nylon tubing sections 158 and 160 deliver the inert gas to the hot gas soldering head assembly 58.

The apparatus employs hydrogen or helium gas as a heating agent because of their good thermal conducting characteristics and because they contain no oxygen. The gas tends to clean the area to be soldered as well as envelope the solder joint in an inert heated gas atmosphere during soldering to eliminate oxidation. Preferably, during the fabrication of the printed circuit board, lead-tin solder is electroplated onto the land pattern. The thickness of .003 inch to .004 inch of pretin is sufficient to tin both the land pattern and the flat pack leads when they are heated simultaneously in the heated gas atmosphere. This eliminates the need for pretinning of the flat pack lead, although in some applications, it may be necessary to pretin both the leads and the conductive land pattern of the printed circuit board. It is noted that the nozzle ends 100 of the hot gas soldering head assembly 58 do not contact either the flat pack positioning jigs 122 or the outwardly extending leads 96 touching the upper surface of the printed circuit board 62. Adjusting the support members 48 controls the gap between the ends of the nozzles 100 and the leads 96 depending upon the velocity with which the board and its carrier 30 move relative to the hot gas issuing from the nozzles 100, as well as the gas velocity and its temperature.

The operation of the automated soldering apparatus is readily apparent from the above description. Carrier 30 carrying printed circuit board 62 and a plurality of jigs 122 with the flat packs mechanically coupled to the board in aligned rows is inserted within opening 28. The rack on the carrier base bottom engages pinion gear 88 and the carrier is positively fed from front to rear into the soldering area 42. Hot gas from nozzles 100 straddling respective jigs 122 is directed in the path of the moving leads 96. Soldering is accomplished by the forced, heated gas flow 98, at a temperature in the order of 700° F., impacting the flat pack leads 96 and the printed circuit board land pattern 90. The leads and the conductive pattern are simultaneously heated causing the solder plating 94 to soften forming a eutectic solder bond between each flat pack lead 96 and an associated portion of the metal land pattern 90. As the carrier 30 continues to move rearwardly, the leads move out from under the heated gas jets and upon cooling form a high strength joint. In moving rearwardly, the edge 84 of the carrier frame 74 contacts a second microswitch actuator 162. A circuit is completed to a motor 228 associated with spaced track member 36 tending to raise the track member in the direction indicated by arrow 164, FIGURE 2, from the horizontal position shown to a dotted line position. Raising track members 36 results in disengaging the rack of carrier base 32 from the pinion gear. The track members 36 then act, in inclined plane fashion, to cause the carrier 30 to roll down on wheels 34 in a direction at right angles to the initial movement of the carrier into the soldering region 42. The carrier moves exits through opening 40 within left-hand side wall 12 of the console and abuts stop members 38 as mentioned previously.

The automated hot gas soldering apparatus of the present invention is extremely flexible, providing a great variation in the feed velocity of the carrier 30 relative to the hot gas soldering heads, the number of soldering heads used, the spacing between heads and therefore, the spacing between aligned rows or groups of electronic components being soldered to the printed circuit board, the gas temperature impinging the leads for any row of components, and the flow rate of hot gas for each row of electronic components.

Figure 6:
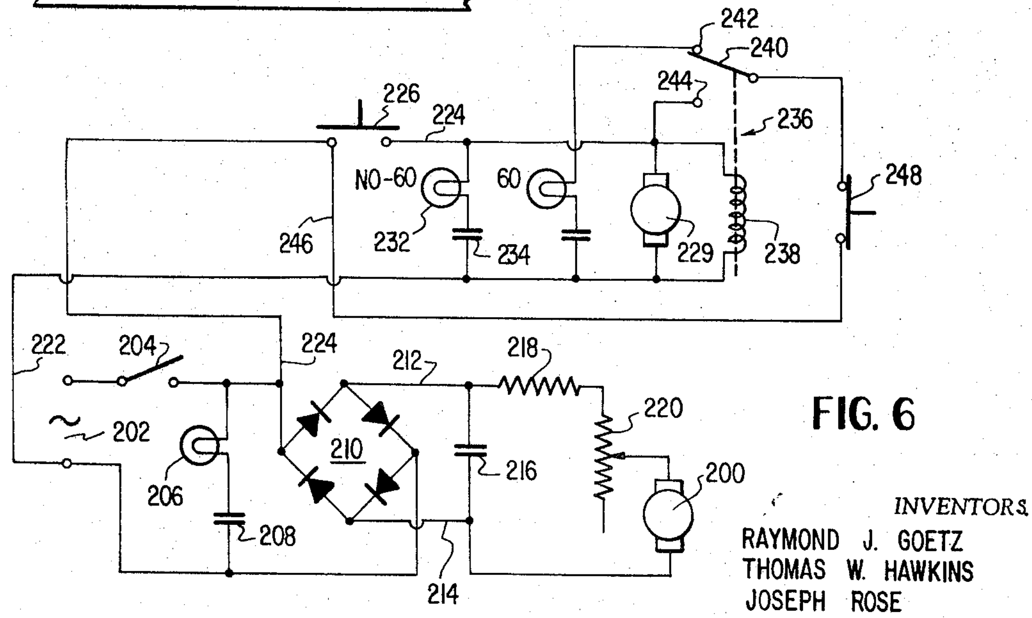
FIGURE 6 is a schematic view of the electrical circuit controlling the printed circuit transport mechanism.

Referring to FIGURE 6, the drive motor (not shown) carried by the console is shown schematically at 200. It comprises a conventional DC series motor which is fed from an alternating current supply 202 through an on-off switch 204. A suitable incandescent lamp 206 is coupled across the supply line between switch 204 and the motor 200, the lamp 206 being connected in series with a capacitor 208, thus controlling its energization. Since motor 200 is a DC motor, a four-way rectifier 210 is connected between the AC source 202 and the motor. The output leads 212 and 214 of the rectifier allow connection of the direct current to the motor through series resistor 218. Capacitor 216 is connected across the rectifier output. Rheostat 220 controls the DC voltage across the series motor 200 and therefore, the speed. The DC source may comprise a standard 115 volt signal. Capacitor 208 may have a value of 1 microfarad, the fixed resistor 218 may comprise a 50 watt 300 ohm resistance while capacitor 216 has a value of 50 microfarads. The rheostat 220 constitutes a 100 ohm 15 watt resistor. The upper half of the electric circuit of FIGURE 6 comprises "go no-go" means, controlling the ramp drive motor for automatically lifting the printed circuit and component carrier subsequent to soldering and causing it to move by gravity toward the discharge opening 40 in side wall 12 of the console. In this respect, leads 222 and 224 from AC supply 202 direct alternating current through normally open microswitch 226 to the ramp drive motor 228. The apparatus is so arranged that when the ramp drive motor 228 is energized, the spaced track members 36 are maintained in their horizontal position adjacent the table top 18, while upon de-energization, the track members 36 and the ramp as defined by cross member 37 is moved to its uppermost or dotted line position as shown in FIGURE 2. Therefore, to ensure proper reception of carrier 30, track members 36 must be down prior to engagement of the rack. Contact of edge 84 of the carrier 30 with the first microswitch actuator 86, causes closure of normally open microswitch contact 226. This places AC ramp motor 288 across lines 222–224 energizing the same to drive platform 37 and spaced rails 36 to the down or full line position shown in FIGURE 2. Simultaneously, with microswitch contacts 226 closed, the lamp 232 is energized through series capacitor 234. Lamp 232 constitutes a "no-go" indicator, forewarning the operator not to insert the next carrier at this time. A holding relay 236 which includes holding coil 238 coupled across the ramp drive motor 228 such that movable contact 240 moves from its normally up position in contact with stationary contact 242 to a down position in contact with contact 244. There is thus provided a holding circuit through line 246, normally closed microswitch contacts 248 and contact 244 ensuring the continued energization of the ramp motor 228 even when the carrier 30 passes over the microswitch actuator 86. Further, with the movable contact 240 in its down position, not only will the holding coil 238 remain energized but also the no-go lamp 232. With the rack drive motor 200 still operating, the carrier 30 is positively driven to the extreme rear position such that its leading edge 84 impinges upon the second microswitch actuator 162 opening the normally closed microswitch contacts 248. With microswitch contacts 248 open, at the same time microswitch contacts 226 are open, all circuits are de-energized including the holding relay coil 238, the ramp drive motor 228 and the no-go and the go neon indicating lamps 232 and 252. Biasing means (not shown) act to move the ramp 37 and rails 36 to their dotted line or up position causing the carrier to move downwardly and to the left through exit opening 40 in the side wall 12 with the carrier wheels 34 rolling on rails 36. As the carrier moves slightly from right to left, as indicated in FIGURE 2, the leading edge 84 will move away from the microswitch actuator 162 and the normally closed microswitch contacts 248 will again close, completing a circuit through line 246, movable contact 240, stationary contact 242, "go" lamp 252 and its associated capacitor 250 to line 224, thus indicating that the soldering area 42 is ready for the reception of a second, manually positioned carrier 30 which is inserted in like manner to the preceding carrier. The operation is repetitive, being fully automatic with the exception of the manual insertion of the carrier until the carrier rack engages the continuously driven rotary pinion 88. In the case of the apparatus shown, manual removal of a completed carrier at the left-hand side of the console after soldering of the printed circuit board is required.

Figure 8:
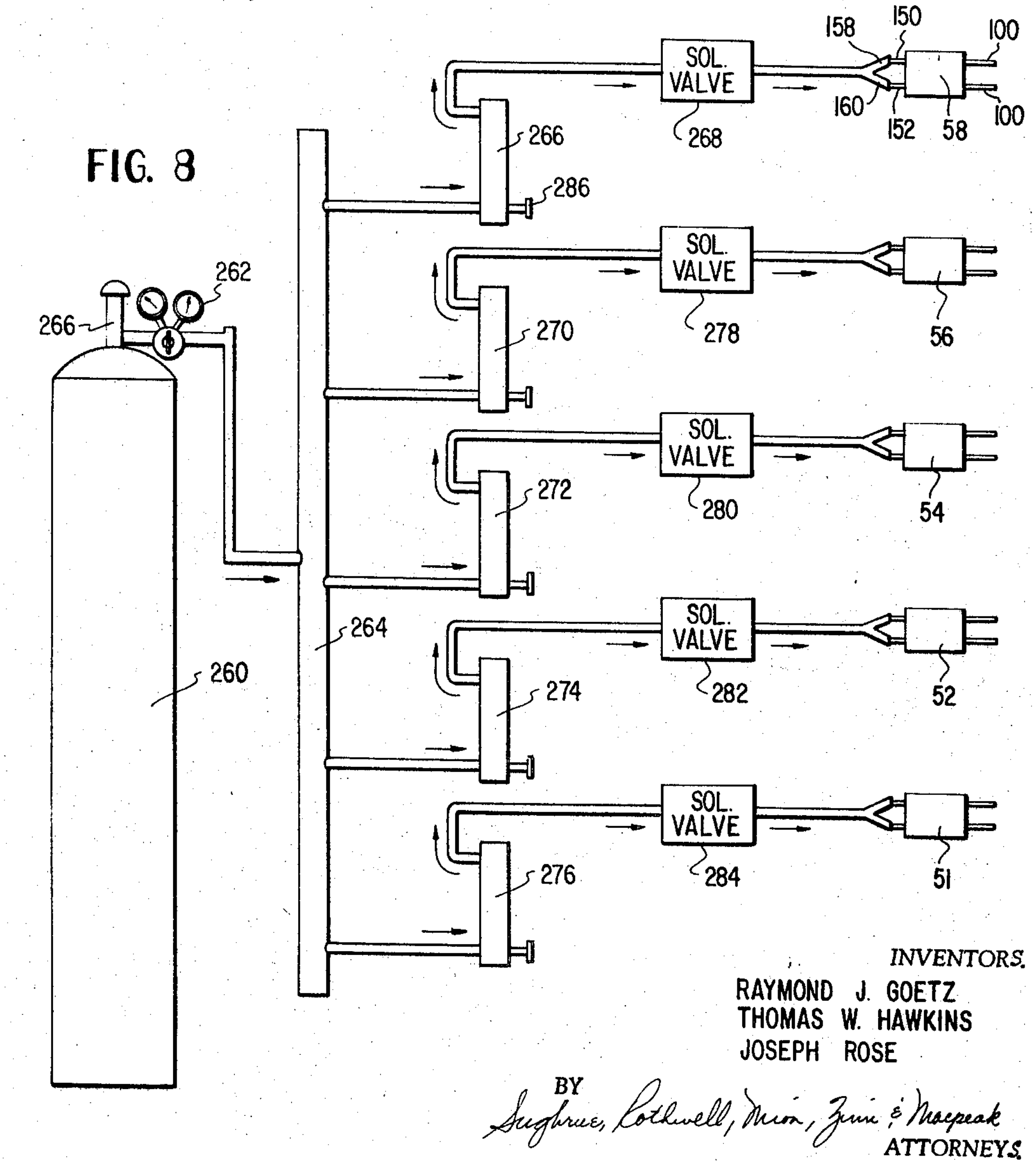
FIGURE 8 is a partial schematic view of the fluid flow path from a common pressurized supply to the individual, spaced hot gas soldering head assemblies.

Turning next to FIGURE 8, the method of selectively controlling the application and rate of flow of gas to the spaced hot gas discharge nozzles 100 may be readily appreciated. A tank of pressurized inert gas, such as helium or hydrogen, is shown at 260 and has a single outlet conduit 266 which is coupled thereto through a pressure regulator valve 262 which sets the output pressure at approximately 10 p.s.i. and delivers the same to manifold 264. Individual supply lines are provided for each of the spaced hot gas solder head assemblies, indicated generally at 58, 56, 54, 52 and 51. In difference to the number of heads shown in FIGURE 2, a fifth head 51 is shown coupled in parallel to the gas supply. The gas is delivered, in conjunction with head 58, through stainless steel tubes 150 and 152, each including nozzle ends 100. The nylon tubing sections 158 and 160 are coupled to manifold 264 through series-connected flow meter 266 and solenoid operated on-off valve 268. In like manner, for soldering heads 56, 54, 52 and 51, flow meters 270, 272, 274 and 276 and solenoid operated on-off valves 278, 280, 282 and 284 are respectively provided. Each of the flow meters includes manually adjustable control means. For instance, flow meter 276 includes a manually operated adjustment knob 286.

Figure 9:
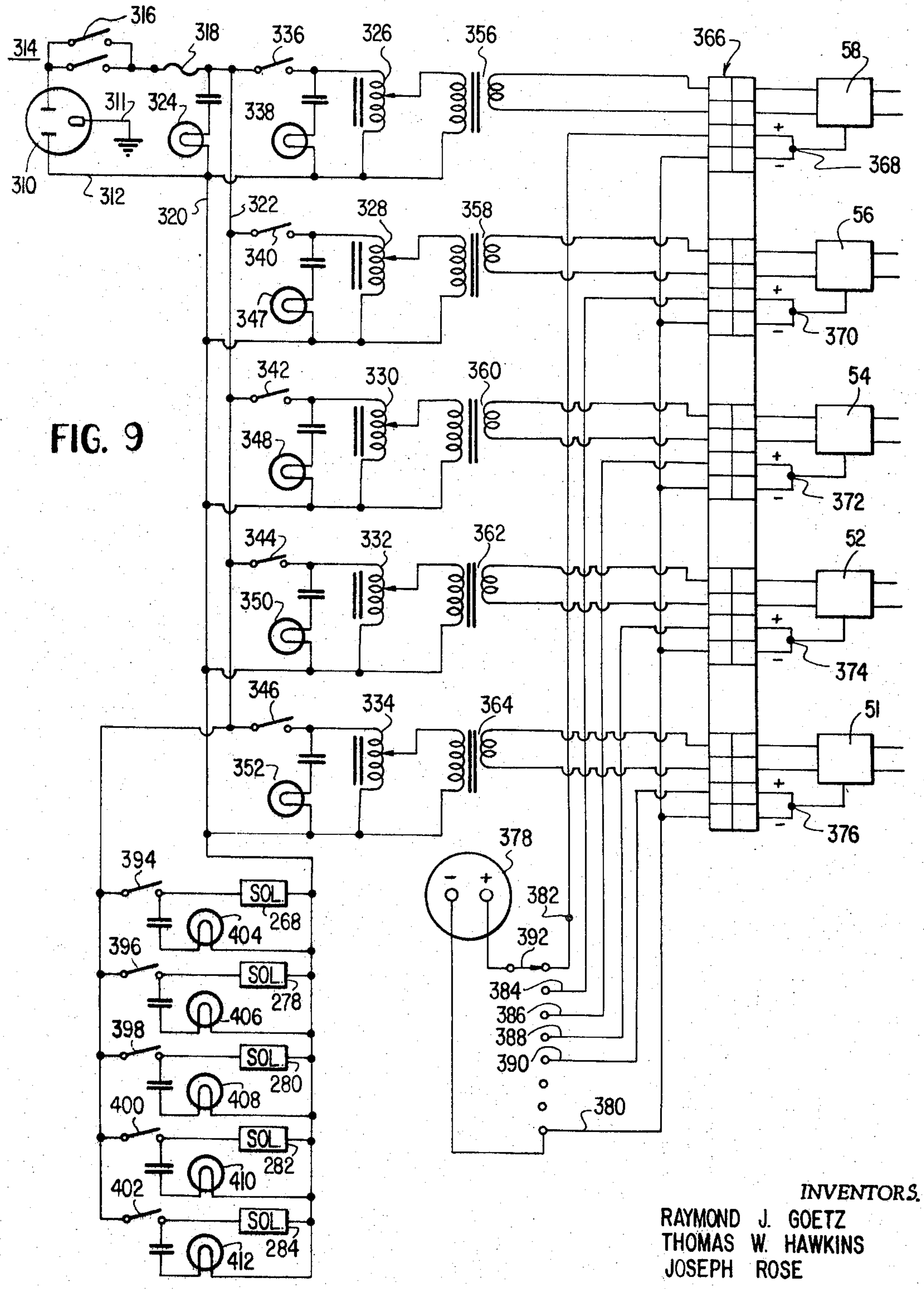
FIGURE 9 is a schematic view of the electrical circuit for controlling the temperature and flow rate of gas delivered to the spaced soldering head assembly nozzles.

The solenoid valve selectively controlling the delivery of gas to the hot gas soldering head assemblies and the electric heating means including the heating loop formed by the stainless steel tube assembly for each soldering head, are conveniently energized from a single source of electrical current. In FIGURE 9, alternating current is delivered through coupling 310 to leads 312 and 314, the coupling member 310 being grounded at 311. A double-throw single-pole switch 316 selectively couples the alternating current supply to bus lines 320–322 through a fuse 318. Closing of the switch contacts acts to light the lamp 324, indicating power to the bus. Each of the heater assemblies is individually controlled through its own autotransformer. For instance, autotransformer 326 associated with head 58 is coupled to the bus through series switch 336. An associated incandescent lamp 338 indicates closure of the on-off switch 336 and energization of the heating transformer 326. Likewise, on-off switches 340, 342, 344 and 346 control selectively the energization of other transformers 328, 330, 332 and 334 associated with soldering heads 56, 54, 52 and 51, respectively. Appropriate incandescent indicating lamps 347, 348, 350 and 352 are provided for respective autotransformers 328, 330, 332 and 334. Step-down transformers 356, 358, 360, 362 and 364 deliver current to the respective closed loop tube heater paths for hot gas soldering head assemblies 58, 56, 54, 52 and 51. Electrical coupling is achieved through a common electrical coupling device 366. If desired, thermocouples, indicated schematically at 368, 370, 372, 374 and 376, are coupled to thermometer 378 through a common negative line 380 and selective positive bus lines 382–390. A movable contact 392 selectively connects the positive side of the thermometer 378 to associated thermocouples 368, 370, 372, 374, and 376, respectively. In this way, the autotransformers for each soldering head assembly may be selectively adjusted and the temperature at the head itself read out by changing tap points between the movable contact 392 and the positive leads.

Further, the delivery of the pressurized gas from manifold 264 to each head assembly may be selectively initiated or terminated by associated solenoid operated valves. The bus line 320 is coupled to one side of the solenoid coils within respective solenoid valves 268, 270, 272, 274 and 276 through manually operated on-off switches 394, 396, 398, 400 and 402, respectively. In parallel with each coil of the solenoid valves and simultaneously energized therewith are appropriate incandescent indicating lamps 404, 406, 408, 410 and 412.

Both the variable actuating means and appropriate indicators are carried on the front side of the vertical panel section 22 (FIGURE 1). The panel 22, as mentioned previously, is selectively removable by removing four or more screws, indicated generally at 414. To facilitate removal, handles 416 are provided on each side of the panel. At the top of the panel, there are provided operating knobs 418, 420, 422, 424, and 426 for selectively controlling the tap point of autotransformers 326, 328, 330, 332 and 334. The switches associated with the autotransformers are identified at 336, 340, 342, 344 and 346. The incandescent lamps indicating energization of the individual gas heater transformer are likewise shown to the right of their respective switches. Immediately below the switches and indicating lights for the transformer, are positioned the associated flow meters 266, 270, 272, 274 and 276. The single thermometer 378 is shown to the right of flow meter 276. The control knob 416 for varying the resistance of rheostate 220 to control the speed of the pinion drive motor 200 is shown immediately below the thermostat. In line with the thermometer and the drive motor control means is the main on-off switch 204 and its associated indicator lamp 206. Below the flow meters are provided associated switches 394, 396, 398, 400 and 402 controlling the solenoid operated valves to selectively feed or prevent the passage of pressurized gas to respective solder head assemblies.

From the above description, it is apparent that with the apparatus in the form shown, a variable number of soldering heads 1 to 5 may be selectively present to provide heated gas through the pair of outlet nozzles at varying flow rates and temperature to achieve reflow soldering of a great number of leads to the printed circuit board or boards carried by the micro-positioner or carrier 30. The selection of the heads, the flow rate of gas and the temperature of the same is readily indicated by the meters carried by front panel section 22. The individual variable power supplies may be readily controlled by rotating control knobs 406 through 414 associated with the autotransformers coupled to each heater. If five heads are used, 400 leads may be readily soldered in 20 seconds which compares quite favorably to a manual operation using conventional soldering tools in which only 14 leads may be soldered in 18 seconds. The number of leads soldered for a given time period may be readily increased depending upon circuit board configuration and the number of soldering heads used. The apparatus provides a high production soldering tool for flat pack integrated circuits, as well as a means of attaching conventional components and modules onto printed circuit boards and substrates that have a high thermal conductivity rating. With a dual four gas jet system an estimated 329.2K solder joints can be made in an eight hour day which means that 23K flat packs can be soldered in place. The apparatus employs hydrogen or helium gas as a heating agent but obviously, other gases could be substituted. The length, width and shape of the gas jets may be modified to suit any particular application, as well as the potting compound. The rectangular ceramic support for the loop feeding coil and hot gas nozzle comprises No. 8 sauereisen. The gauges, meters and valves are standard.

While the invention has been particularly shown and described with reference to a preferred embodiment, it will be understood by those skilled in the art that the foregoing and other changes in form and details may be made therein without departing from the spirit and scope of the invention.

What is claimed is:

1. Automatic soldering apparatus for soldering electronic component leads to a substrate comprising: a carrier for supporting a plurality of said components on said substrate with the leads extending therefrom in parallel rows, soldering head means in juxtaposition to said substrate carrier, said soldering head means including nozzle means for directing heated gas locally onto said lead portions in contact with said substrate, and means for moving said substrate carrier along a path in a direction of said row axis to effect soldering.

2. Apparatus as claimed in claim 1 further including means for controlling the rate of flow of hot gas through said nozzle means.

3. Apparatus as claimed in claim 1 further including means for controlling the amount of heat applied to the gas prior to discharge from said nozzle means.

4. Apparatus as claimed in claim 1 further including means for varying the velocity of said carrier as it moves relative to said soldering head means.

5. The apparatus as claimed in claim 1 wherein said carrier comprises a rectangular plate-like body including a rack fixed to the bottom thereof and said apparatus further includes continuously driven gear means carried by said apparatus, whereby said gear means upon engagement with said rack positively drives said carrier along a fixed feed path at right angles to the plane of said soldering heads.

6. The apparatus as claimed in claim 1 including first drive means for moving said carrier along a feed path at right angles to the plane of said nozzle means from one side of said nozzle means to the other, and second drive means for moving said carrier along a discharge path at right angles to said feed path and to the rear of said plane.

7. The apparatus as claimed in claim 6 wherein said carrier includes wheels mounted for free rotation about an axis parallel in line with said feed path, and said second drive means comprises an inclined track adapted to engage said wheel and effect gravity movement of said carrier along said discharge path.

8. The apparatus as claimed in claim 7 further including a first microswitch positioned in the feed path of said carrier for energizing positive drive means to maintain said inclined track below and out of engagement with said carrier wheels and a second microswitch spaced from said first microswitch beyond said hot gas soldering head means for de-energizing said positive drive means as said carrier reaches the end of said feed path to allow said track to move to an inclined position.

9. The movable carrier for an automated soldering apparatus including drive means for driving said carrier relative to stationary soldering head means comprising: a plate-like carrier body for receiving a sheet-like substrate, a component positioner comprising a bar of insulation material including a longitudinal, central recess forming raised outer edges, said recess adapted to receive a series of electronic components, said raised outer edges being slotted to receive the component leads and means for clamping the component positioner in inverted position on said substrate with said leads extending outwardly of said positioner to form parallel rows of spaced leads along the sides thereof.

10. The carrier as claimed in claim 9 further including upstanding, spaced alignment pins coupled to said plate-like carrier body, cooperating holes formed on opposed ends of said component positioner and latching means carried by said component positioner for engaging the protruding ends of said pins to latch said component leads in place against said substrate.

11. The positioner as claimed in claim 10 wherein each pin includes circumferential recess near its outer end, and said apparatus further includes means for spring-biasing each pin downwardly toward said carrier body and said latching means comprises a U-shaped slide carried by said component positioner and means for mounting said slide on said component positioner for movement of its slotted end into a pin circumferential recess to thereby lock the positioner in place and to spring-bias the component leads against said substrate.

12. The apparatus as claimed in claim 1 wherein said soldering head means comprises at least one hot gas head assembly having metal tube sections including nozzle ends adapted to straddle said component and to direct separate gas jets onto oppositely directed component leads, means joining said metal tube sections rearwardly of said nozzle ends and means for coupling an electrical potential across said tube sections remote from said tube section joint to form a low resistance heater loop for heating gas flowing through said tube sections toward said nozzle ends.

13. The apparatus as claimed in claim 12 wherein said tube sections are looped and said apparatus further includes means for encapsulating said loops in ceramic insulative material to reduce heat loss.

14. The apparatus as claimed in claim 1 wherein said soldering head means comprises a plurality of spaced, head assemblies fixedly positioned above said carrier feed path at right angles thereto, including gas directing nozzles, and said apparatus further includes means for individually controlling the heat applied to the metal tube section, the rate of flow of gas passing through the tube sections, and the spacing between the gas soldering head nozzles and the component leads.

References Cited

UNITED STATES PATENTS 2,658,466 11/1953 Hall -------------- 288—47 X

RICHARD H. EANES, Jr., *Primary Examiner.*

U.S. Cl. X.R.

29—589